(12) United States Patent
Kakiuchi et al.

(10) Patent No.: US 9,627,294 B2
(45) Date of Patent: Apr. 18, 2017

(54) SEMICONDUCTOR DEVICE AND METHOD OF MANUFACTURING THE SAME

(71) Applicant: TOYOTA JIDOSHA KABUSHIKI KAISHA, Toyota-shi, Aichi-ken (JP)

(72) Inventors: Eisaku Kakiuchi, Toyota (JP); Yasuo Kinoshita, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/835,166

(22) Filed: Aug. 25, 2015

(65) Prior Publication Data

US 2016/0064305 A1    Mar. 3, 2016

(30) Foreign Application Priority Data

Aug. 28, 2014   (JP) ................................. 2014-174271

(51) Int. Cl.
| | |
|---|---|
| *H05K 5/00* | (2006.01) |
| *H05K 7/00* | (2006.01) |
| *H01L 23/473* | (2006.01) |
| *H01L 25/10* | (2006.01) |

(Continued)

(52) U.S. Cl.
CPC .......... *H01L 23/473* (2013.01); *H01L 25/105* (2013.01); *H01L 21/4882* (2013.01); *H01L 23/40* (2013.01); *H01L 23/4006* (2013.01); *H01L 23/4012* (2013.01); *H01L 2023/4087* (2013.01); *H01L 2225/1076* (2013.01); *H01L 2225/1094* (2013.01); *H01L 2924/0002* (2013.01)

(58) Field of Classification Search
CPC .............. H01L 23/473; H05K 7/20927; H05K 7/20872; H05K 7/20763; H05K 7/20845
USPC .......................... 361/699, 688, 689, 698, 700
See application file for complete search history.

(56) References Cited

U.S. PATENT DOCUMENTS 3,573,569 A *   4/1971   Davis .................... H01L 23/427
                                                              257/686
9,437,523 B2 *  9/2016   Joshi ................... H01L 23/4735
                          (Continued)

FOREIGN PATENT DOCUMENTS

| JP | 2008-271770 A | 11/2008 |
|---|---|---|
| JP | 2009-212137 A | 9/2009 |
| JP | 2012-205478 A | 10/2012 |

*Primary Examiner* — Anthony Haughton
(74) *Attorney, Agent, or Firm* — Oliff PLC

(57) ABSTRACT

A semiconductor device includes: a stacked unit including a semiconductor module and a plurality of coolers each having a flow passage through which a coolant flows, the semiconductor module being disposed between the coolers; a coolant supply-discharge pipe configured to supply the coolant to the coolers or discharge the coolant from the coolers, the coolant supply-discharge pipe being passed through the stacked unit in a stacking direction of the stacked unit; a displacement restricting member provided at a first end portion of the coolant supply-discharge pipe, the displacement restricting member being configured to restrict displacement of the stacked unit in the stacking direction of the stacked unit; and a pressurizing member provided at a second end portion of the coolant supply-discharge pipe, the pressurizing member being configured to apply force to the stacked unit in a direction toward the first end portion.

7 Claims, 8 Drawing Sheets

(51) Int. Cl.
*H01L 21/48* (2006.01)
*H01L 23/40* (2006.01)

(56) References Cited

U.S. PATENT DOCUMENTS

| | | | |
|---|---|---|---|
| 2006/0096299 A1* | 5/2006 | Mamitsu | H01L 23/473 |
| | | | 62/3.2 |
| 2006/0219396 A1* | 10/2006 | Abei | F28D 1/0333 |
| | | | 165/164 |
| 2008/0239663 A1 | 10/2008 | Yamamoto et al. | |
| 2008/0253085 A1* | 10/2008 | Soffer | G06F 1/18 |
| | | | 361/679.4 |
| 2012/0250252 A1* | 10/2012 | Iguchi | H05K 7/20927 |
| | | | 361/689 |
| 2015/0189790 A1* | 7/2015 | Tachibana | H05K 7/20927 |
| | | | 361/699 |

* cited by examiner

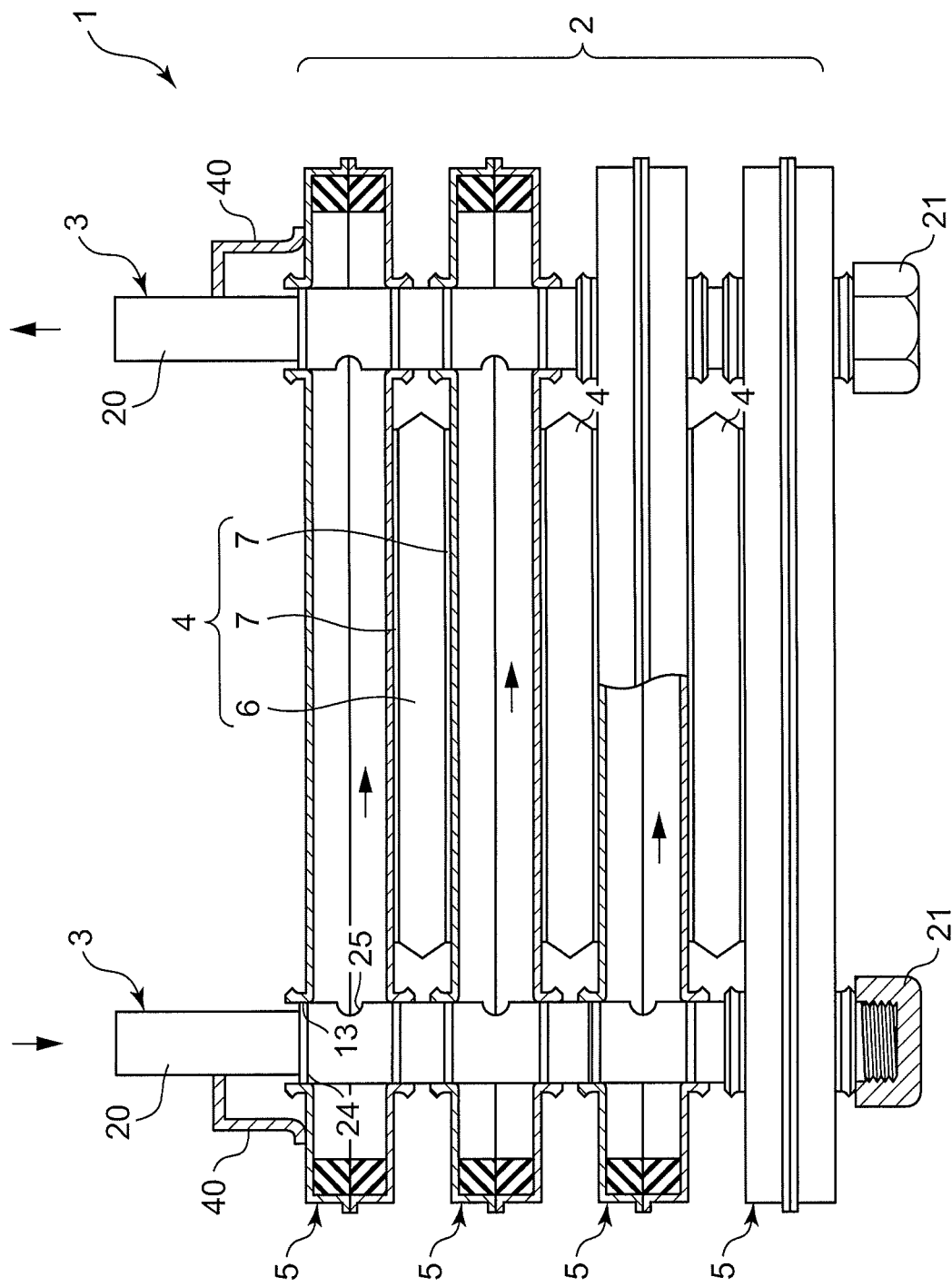

SEMICONDUCTOR DEVICE AND METHOD OF MANUFACTURING THE SAME

INCORPORATION BY REFERENCE

The disclosure of Japanese Patent Application No. 2014-174271 filed on Aug. 28, 2014 including the specification, drawings and abstract is incorporated herein by reference in its entirety.

BACKGROUND OF THE INVENTION

1. Field of the Invention

The invention relates to a semiconductor device and a method of manufacturing the same.

2. Description of Related Art

A technology pertaining to a semiconductor device and a method of manufacturing the same is described in Japanese Patent Application Publication No. 2012-205478 (JP 2012-205478 A). JP 2012-205478 A describes an electric power converter including a semiconductor stacked unit, an elastic member, a frame and a closure member. The semiconductor stacked unit includes semiconductor modules and coolers that are stacked alternately. The frame has an opening, and houses therein the semiconductor stacked unit and the elastic member. The closure member is fixed in the opening of the frame such that the elastic member pressurizes the semiconductor stacked unit in a direction in which the semiconductor modules and the coolers are stacked (hereinafter, referred to as "stacking direction").

With the configuration described in JP 2012-205478 A, the semiconductor stacked unit is pressurized in the stacking direction, so that the semiconductor modules and the coolers are brought into close contact with each other. Thus, the semiconductor modules that generate heat are efficiently cooled by the coolers.

In the configuration described in JP 2012-205478 A, however, the frame and the closure member are indispensable in keeping the semiconductor stacked unit pressurized in the stacking direction, and the electric power converter becomes large accordingly.

SUMMARY OF THE INVENTION

A first aspect of the invention relates to a semiconductor device including: a stacked unit including a semiconductor module and a plurality of coolers each having a flow passage through which a coolant flows, the semiconductor module being disposed between the coolers; a coolant supply-discharge pipe configured to supply the coolant to the coolers or discharge the coolant from the coolers, the coolant supply-discharge pipe being passed through the stacked unit in a stacking direction of the stacked unit; a displacement restricting member provided at a first end portion of the coolant supply-discharge pipe, the displacement restricting member being configured to restrict displacement of the stacked unit in the stacking direction of the stacked unit; and a pressurizing member provided at a second end portion of the coolant supply-discharge pipe, the pressurizing member being configured to apply force to the stacked unit in a direction toward the first end portion.

A second aspect of the invention relates to a method of manufacturing a semiconductor device. The method includes: forming a stacked unit by disposing a semiconductor module and a plurality of coolers each having a flow passage through which a coolant flows, such that the semiconductor module is disposed between the coolers; passing a coolant supply-discharge pipe through the stacked unit; providing a first end portion of the coolant supply-discharge pipe with a displacement restricting member configured to restrict displacement of the stacked unit in a stacking direction of the stacked unit; and providing a second end portion of the coolant supply-discharge pipe with a pressurizing member configured to apply force to the stacked unit in a direction toward the first end portion.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 8 is a partially cutaway front view of a power stack according to a second embodiment of the invention.

DETAILED DESCRIPTION OF EMBODIMENTS

Hereinafter, a power stack 1 according to a first embodiment of the invention will be described with reference to FIG. 1 to FIG. 7. The power stack 1 is a semiconductor device that functions as an electric power converter such as an inverter or a converter.

Figure 1:
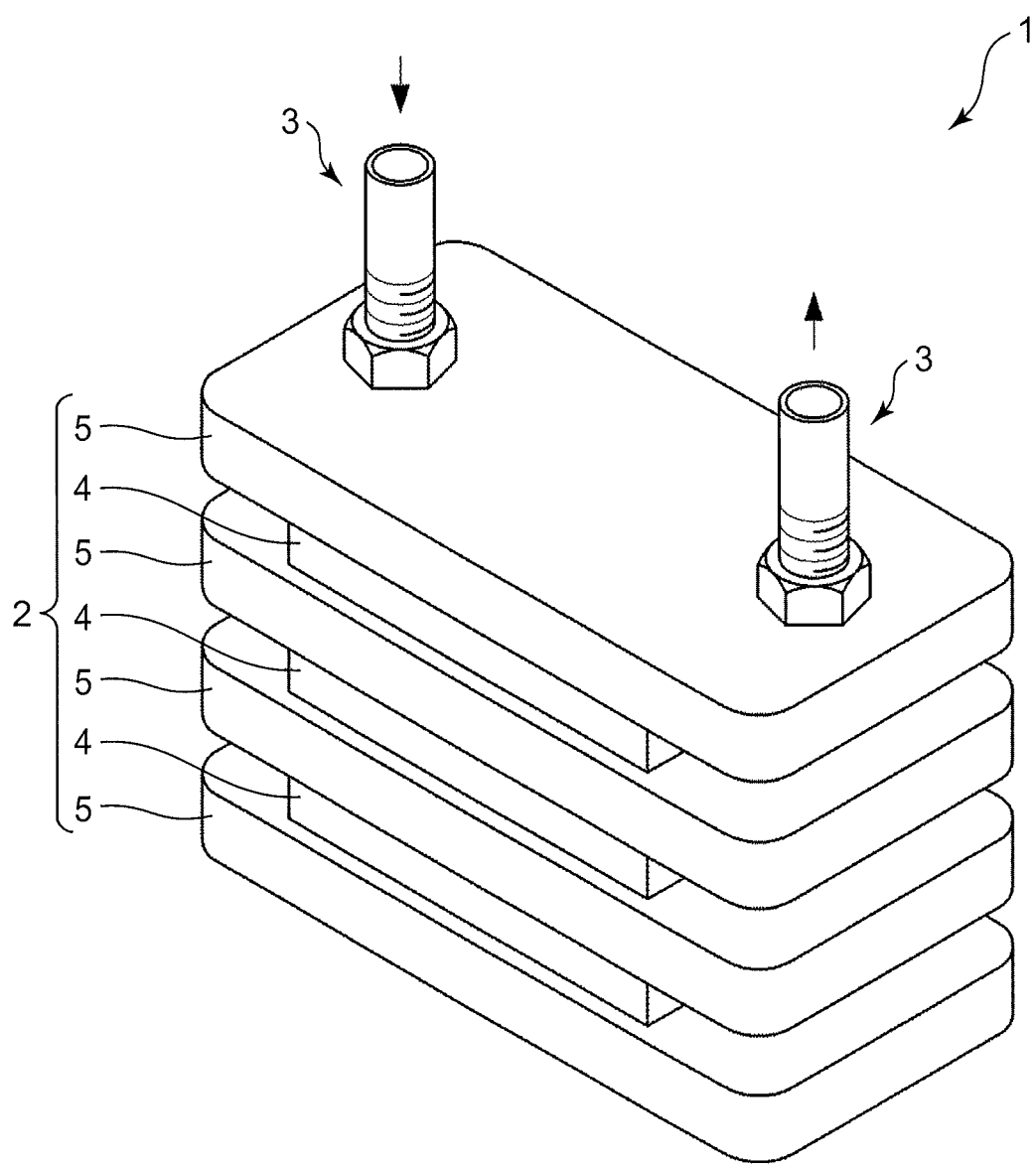
FIG. 1 is a perspective view of a power stack according to a first embodiment of the invention.
Figure 2:
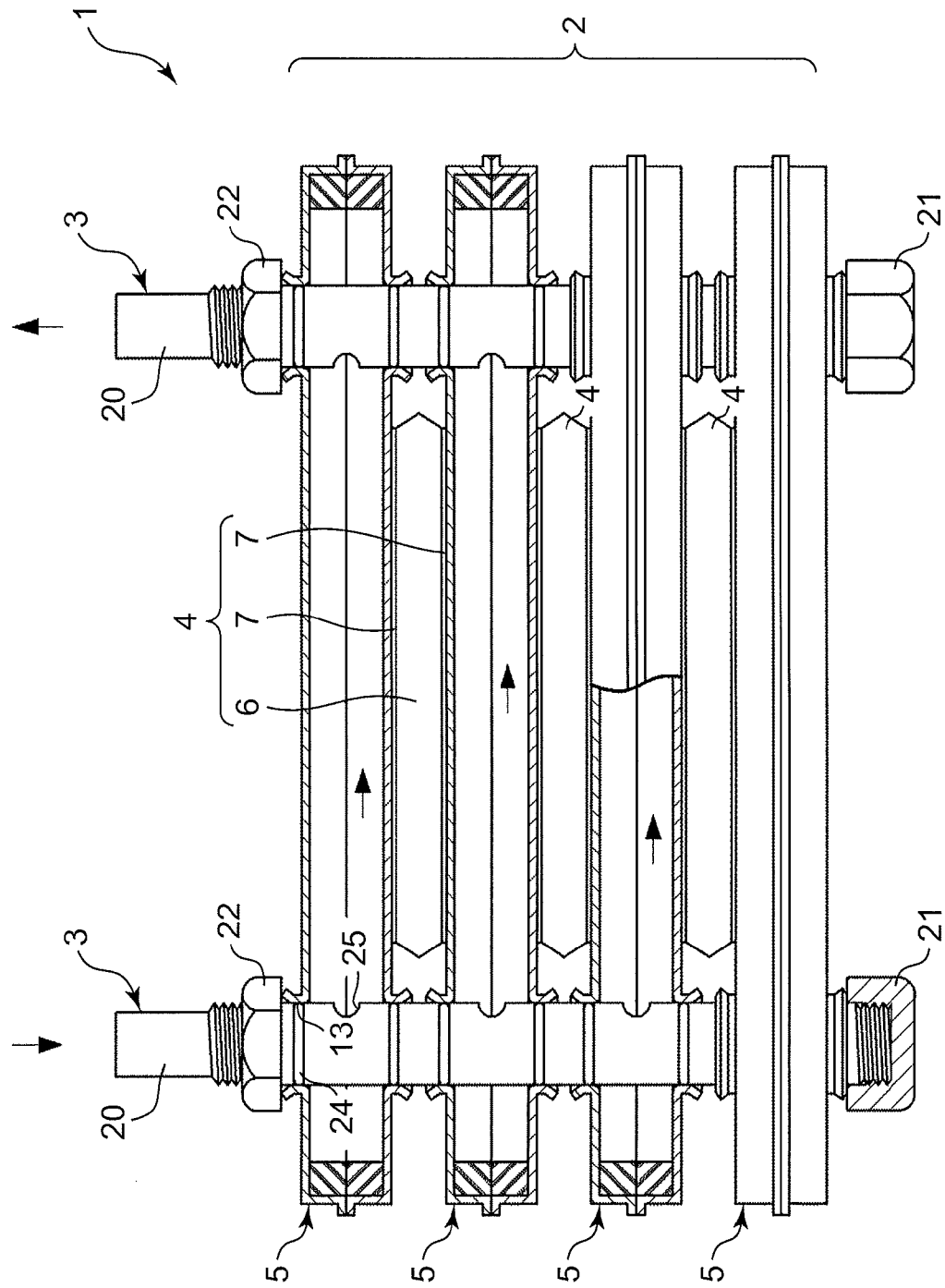
FIG. 2 is a partially cutaway front view of the power stack according to the first embodiment of the invention.

FIG. 1 is a perspective view of the power stack 1. FIG. 2 is a partially cutaway front view of the power stack 1. As illustrated in FIG. 1 and FIG. 2, the power stack 1 includes a stacked unit 2 and two pipe assemblies 3.

The stacked unit 2 includes three power card units 4 (each of which is an example of "semiconductor module" in the invention) and four coolers 5 that are stacked alternately.

As illustrated in FIG. 2, each of the power card units 4 includes a power card 6 and insulation sheets 7. The power card 6 is flattened in shape. One of the insulation sheets 7 is disposed on the top surface of the power card 6, and the other one of the insulation sheets 7 is disposed on the undersurface of the power card 6. Each power card 6 is a semiconductor package in which a power semiconductor device such as a MOSFET is housed. An appropriate amount of grease (not illustrated) is applied to each of the insulation sheets 7.

Figure 3:
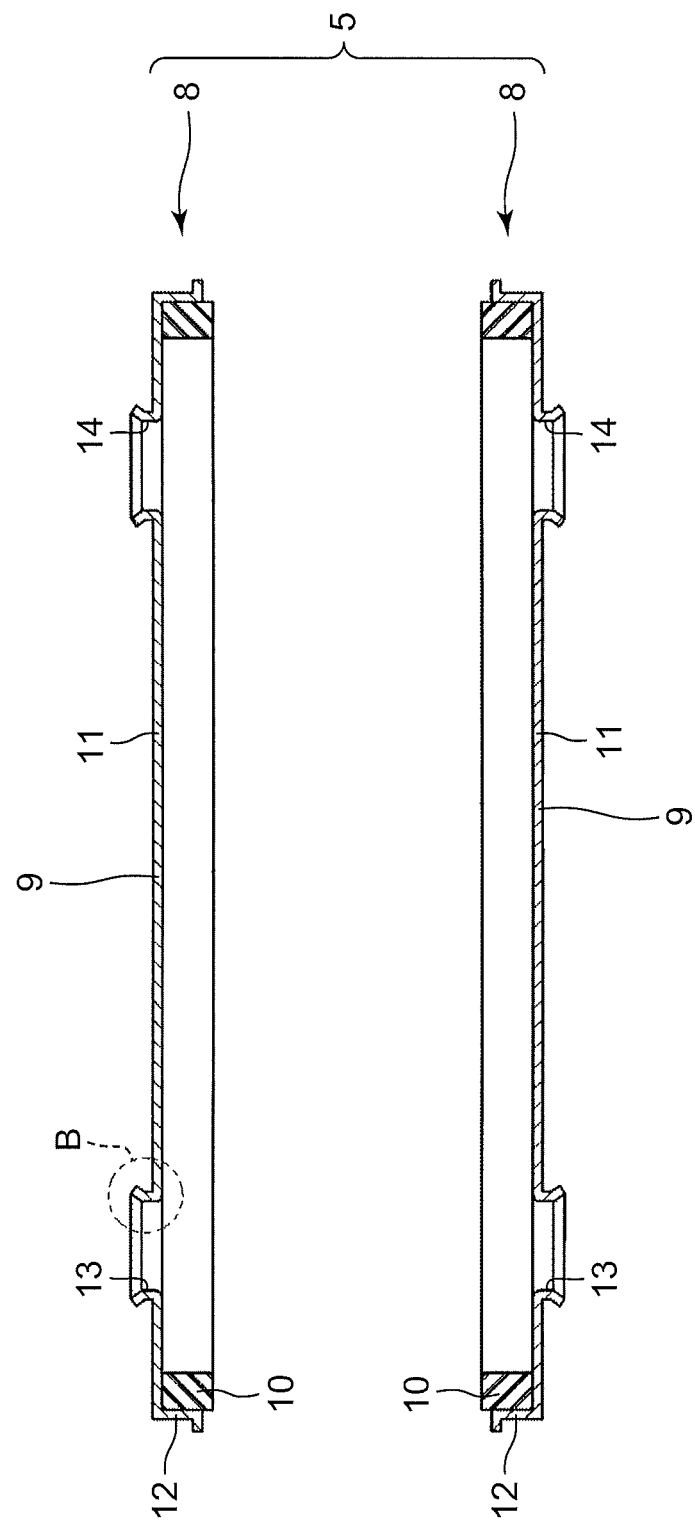
FIG. 3 is an exploded sectional front view of a cooler according to the first embodiment of the invention.
Figure 4:
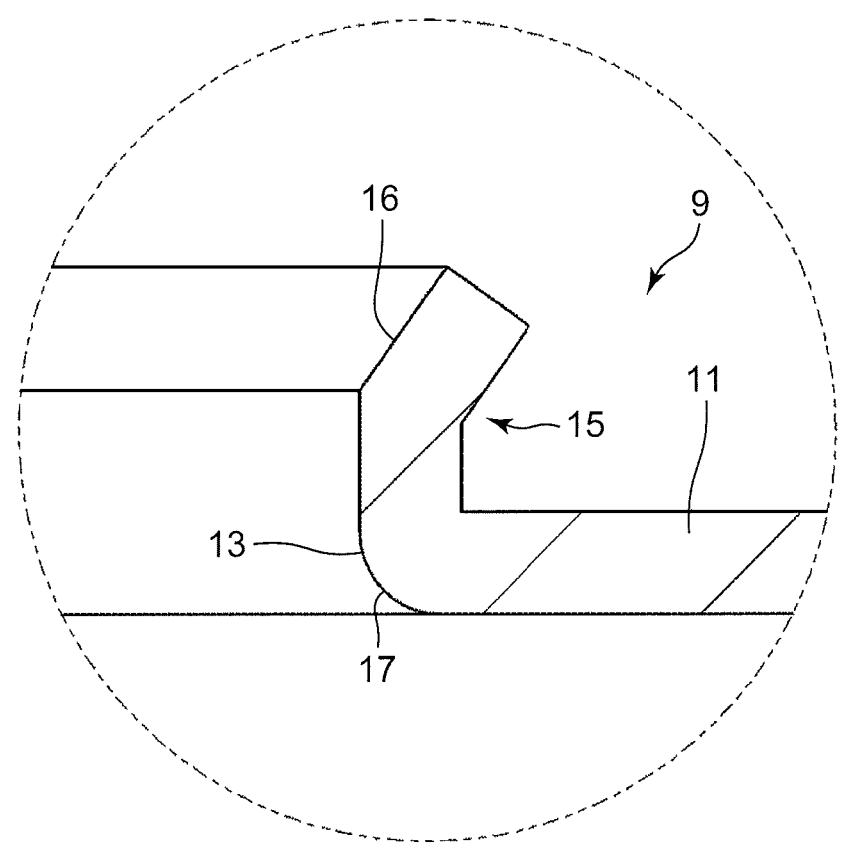
FIG. 4 is an enlarged view of a portion B in FIG. 3.
Figure 5:
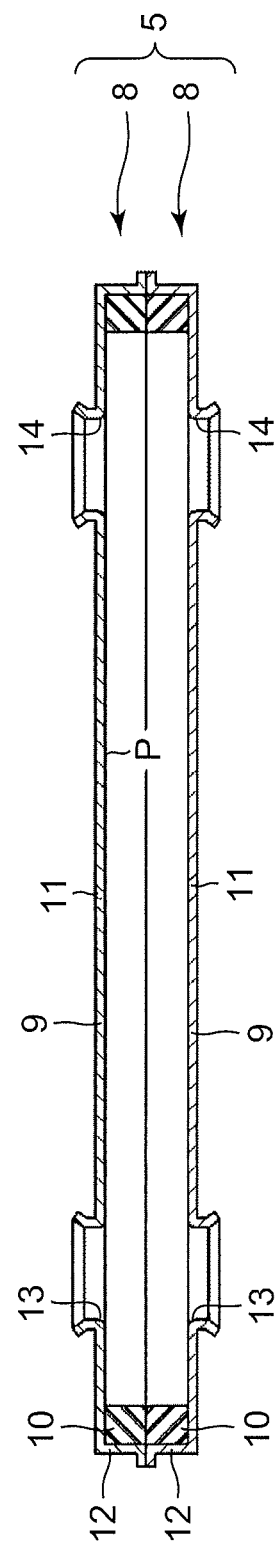
FIG. 5 is a sectional front view of the cooler according to the first embodiment of the invention.

Each of the coolers 5 has a hollow box shape. A flow passage P, through which a coolant such as cooling water flows, is formed in each cooler 5. As illustrated in FIG. 3, each cooler 5 is composed of two segments 8. Each of the segments 8 includes a casing 9, and a seal member 10 in the shape of a closed frame. The casing 9 has a partition plate 11 and a peripheral wall 12. The partition plate 11 is perpendicular to a direction in which the power card units 4 and the cooler 5 are stacked (hereinafter, referred to as "stacking direction"). The peripheral wall 12 extends in the stacking direction from the peripheral edge of the partition plate 11. Each partition plate 11 has an upstream through-hole 13 (an example of "through-hole" in the invention) and a downstream through-hole 14 (an example of "through-hole" in the invention). The upstream through-hole 13 and the downstream through-hole 14 are formed by, for example, burring (i.e., a process of forming a hole and a flange around the hole). FIG. 4 is an enlarged view of a portion B in FIG. 3. As illustrated in FIG. 4, a distal end portion of a cylindrical flange 15, which is formed while the upstream through-hole 13 is formed by burring, is bent obliquely by, for example, pressing, such that the inner diameter of the distal end portion increases. Thus, a pipe guide surface 16 (an example of "guiding portion" in the invention) that extends obliquely is formed. In addition, while the upstream through-hole 13 is formed by burring, a curved surface 17 (an example of "guiding portion" in the invention) is formed in a portion of the partition plate 11, which defines the upstream through-hole 13. The same applies to the downstream through-hole 14. Referring again to FIG. 3, the seal member 10 is disposed along the inner periphery of the peripheral wall 12 in the shape of a closed frame. As illustrated in FIG. 5, when the two segments 8 are coupled to each other, the flow passage P is formed between the upstream through-holes 13 and the downstream through-holes 14. Thus, the cooler 5 having the flow passage P is completed. The peripheral walls 12 of the two segments 8 are welded together to couple the segments 8 to each other. For example, brazing is suitable as the welding. Alternatively, the two segments 8 may be coupled to each other by caulking instead of welding, or may be coupled to each other with an adhesive.

Figure 6:
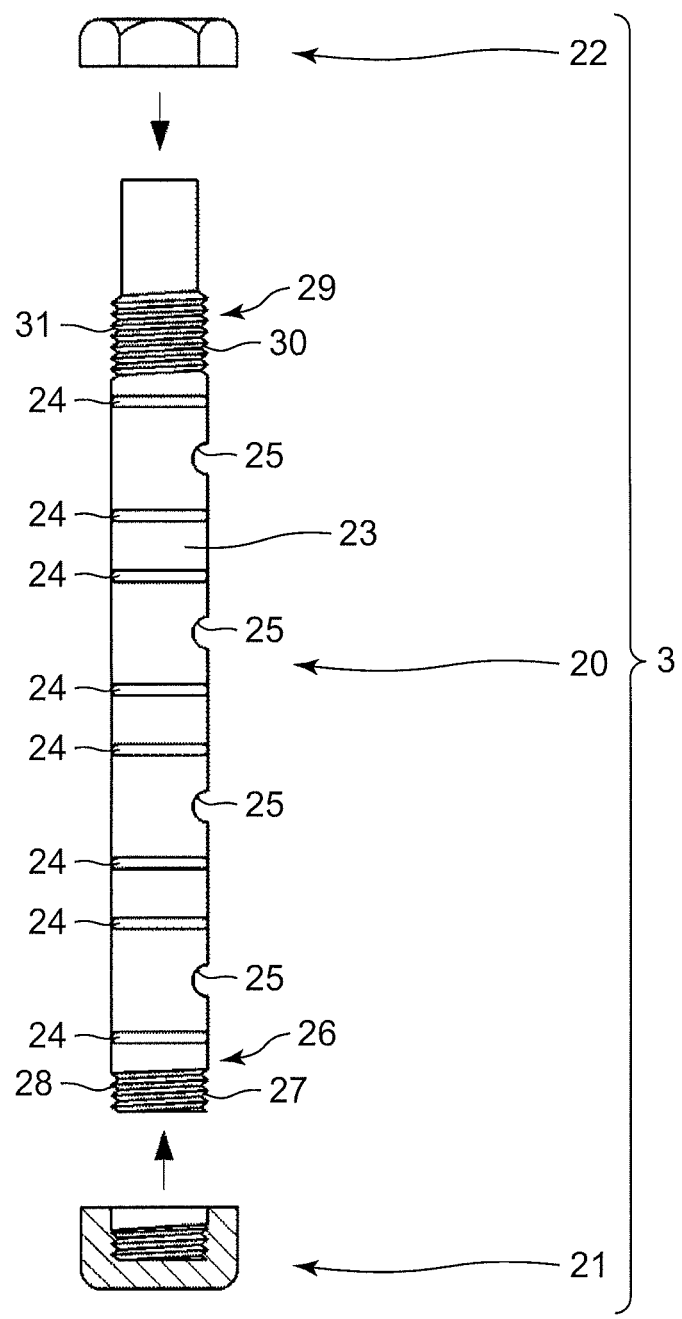
FIG. 6 is an exploded front view of a pipe assembly according to the first embodiment of the invention.

FIG. 6 illustrates an exploded front view of each of the pipe assemblies 3. As illustrated in FIG. 6, each pipe assembly 3 includes a pipe unit 20, a threaded cap 21 (an example of "displacement restricting member" in the invention), and a nut 22 (an example of "pressuring member" in the invention).

The pipe unit 20 includes a pipe 23 (an example of "coolant supply-discharge pipe" in the invention), and eight O-rings 24. The pipe 23 is a cylindrical body that extends in the stacking direction. The peripheral wall of the pipe 23 has four openings 25 located at intervals in the stacking direction. The eight O-rings 24 are arranged on the outer peripheral surface of the pipe 23. More specifically, the eight O-rings 24 are arranged to be aligned over the four openings 25 such that one opening 25 is located between two O-rings 24. The outer peripheral surface 27 of a lower end portion 26 of the pipe 23 has a thread 28 that allows the threaded cap 21 to be attached to the lower end portion 26 of the pipe 23. An outer peripheral surface 30 of an upper end portion 29 of the pipe 23 has a thread 31 that allows the nut 22 to be attached to the upper end portion 29 of the pipe 23.

The threaded cap 21 is a threaded cap in which a seal member (not illustrated) is incorporated. By attaching the threaded cap 21 to the lower end portion 26 of the pipe 23, the lower end portion 26 of the pipe 23 is sealed.

Figure 7:
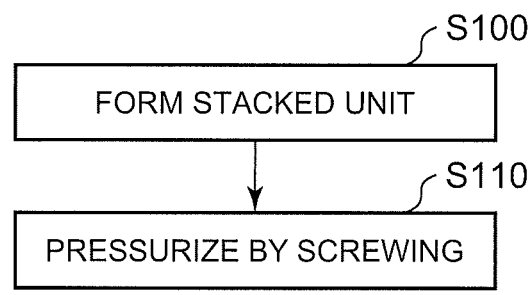
FIG. 7 is a flowchart illustrating steps of manufacturing the power stack according to the first embodiment of the invention.

Next, a method of assembling the power stack 1 will be described. FIG. 7 is a flowchart illustrating steps of manufacturing the power stack 1.

First, as illustrated in FIG. 6, the eight O-rings 24 are attached to each of the pipes 23. Subsequently, the threaded cap 21 is attached to the lower end portion 26 of each of the pipes 23. In this way, two pipe units 20 each including the pipe 23 to which the threaded cap 21 is attached are prepared.

Subsequently, the two pipe units 20 are fixed at positions apart from each other by a prescribed distance, and the four coolers 5 and the three power card units 4 are stacked alternately by using the two pipe units 20 (S100). More specifically, as illustrated in FIG. 5, each of the coolers 5 has the two upstream through-holes 13 and the two downstream through-holes 14. Therefore, one of the pipe units 20 is passed through the two upstream through-holes 13 of each of the coolers 5, and the other one of the pipe units 20 is passed through the two downstream through-holes 14 of each of the coolers 5.

When one of the pipe units 20 is passed through the two upstream through-holes 13 of each of the coolers 5, the pipe unit 20 is appropriately guided to the upstream through-hole 13 on the lower side by the pipe guide surface 16 illustrated in FIG. 4, and the pipe 23 is appropriately guided to the upstream through-hole 13 on the upper side by the curved surface 17 illustrated in FIG. 4.

Finally, the nut 22 is attached to the upper end portion 29 of the pipe 23 of each of the pipe units 20, and the nut 22 is tightened at a prescribed torque (S110). Thus, the stacked unit 2 is pressurized in the stacking direction. More specifically, when the two nuts 22 are tightened, the topmost cooler 5 is pushed downward. When the topmost cooler 5 is pushed downward, the power cards 6 come into close contact with the coolers 5 via the insulation sheets 7, so that thermal resistance between the coolers 5 and the power cards 6 is reduced.

FIG. 2 illustrates the assembled power stack 1. As illustrated in FIG. 2, in the assembled power stack 1, the openings 25 of the pipe assemblies 3 are located within the flow passages P of the coolers 5. Further, the O-rings 24 of the pipe assemblies 3 are in close contact with the wall surfaces of the upstream through-holes 13 and the wall surfaces of the downstream through-holes 14 of the coolers 5.

Next, how to use the power stack 1 will be described.

As illustrated in FIG. 2, when a coolant is supplied to the pipe unit 20 on the left side, the pipe unit 20 on the left side supplies the coolant to the four coolers 5. The coolant supplied to the coolers 5 is heated while flowing through the flow passages P, and is then discharged into the pipe unit 20 on the right side. The heated coolant is then discharged outside from the pipe unit 20 on the right side. Thus, the heat generated due to the operation of the power cards 6 is recovered by the coolant, so that the power cards 6 are allowed to operate under an appropriate temperature.

The first embodiment of the invention described above has the following characteristics.

(1) The power stack 1 (an example of "semiconductor device" in the invention) includes the stacked unit 2 and the pipes 23 (each of which is an example of "supply-discharge pipe" in the invention). The stacked unit 2 includes a plurality of the power card units 4 (each of which is an example of "semiconductor module" in the invention) and a plurality of the coolers 5 each having the flow passage P through which the coolant flows. The power card units 4 and the coolers 5 are stacked alternately to form the stacked unit 2. One of the pipes 23 is used to supply the coolant to the coolers 5, and the other one of the pipes 23 is used to discharge the coolant from the coolers 5. The pipes 23 are disposed so as to pass through the stacked unit 2 in the stacking direction, and the thread 31 is formed on the outer peripheral surface 30 of each of the pipes 23. The power stack 1 further includes the nuts 22 (an example of "pressurizing member" in the invention) that are screwed onto the threads 31 to keep the stacked unit 2 pressurized in the stacking direction. This configuration makes it possible to omit the frame and the closure member described in JP 2012-205478 A without reducing the function of keeping the stacked unit 2 pressurized in the stacking direction. Thus, the power stack 1 that is small in size is obtained.

(2) The pipes 23 pass through the coolers 5 of the stacked unit 2. Each of the coolers 5 includes the two partition plates 11 that face each other across the flow passage P in the stacking direction. Each of the partition plates 11 has the upstream through-hole 13 and the downstream through-hole 14, through which the pipes 23 are passed. Each of the two partition plates 11 has the pipe guide surfaces 16 (each of which is an example of "guiding portion" in the invention) and the curved surfaces 17 (each of which is an example of "guiding portion" in the invention). The pipe guide surfaces 16 and the curved surfaces 17 are used to guide the pipes 23 to the upstream through-holes 13 and the downstream through-holes 14 when the pipes 23 are inserted into the upstream through-holes 13 and the downstream through-holes 14. With this configuration, the workability in inserting the pipes 23 into the upstream through-holes 13 and the downstream through-holes 14 is improved.

(3) The power stack 1 is manufactured as follows: the stacked unit 2 is formed by alternately stacking the power card units 4 and the coolers 5 each having the flow passage P through which the coolant flows (S100); and the stacked unit 2 is pressurized in the stacking direction by screwing the nuts 22 onto the threads 31 of the pipes 23 disposed so as to pass through the stacked unit 2 in the stacking direction (S110).

While the first embodiment of the invention has been described above, the first embodiment may be modified as follows.

In the first embodiment, the thread 28 is formed on the outer peripheral surface 27 of the lower end portion 26 of each of the pipes 23, so that the threaded cap 21 can be attached to the lower end portion 26 of each of the pipes 23. Alternatively, the threaded cap 21 may be attached to the lower end portion 26 of each of the pipes 23 by another method such as bonding, welding, or press-fitting.

The partition plates 11 of each cooler 5 may be provided with radiating fins that project into the flow passage P. With this configuration, heat exchange between the partition plates 11 and the coolant is effectively promoted.

In the first embodiment, the nut 22 is attached to the upper end portion 29 of each of the pipes 23, and the stacked unit 2 is pressurized in the stacking direction by tightening the nuts 22. Alternatively, in a second embodiment of the invention, elastic bodies such as plate springs 40 are disposed between the upper end portions 29 and the stacked unit 2 to apply elastic force to the stacked unit 2 in a direction toward the lower end portions 26, so that the stacked unit 2 may be pressurized in the stacking direction with the elastic force of the elastic bodies, as illustrated in FIG. 8. Further, other configurations for applying force from the upper end portions 29 to the stacked unit 2 in the stacking direction may be employed.

According to the foregoing embodiments, the stacked unit 2 is pressurized downward from the upper end portions 29. Alternatively, the stacked unit 2 may be pressurized upward from the lower end portions 26.

The embodiments described above provide a technology for reducing the size of semiconductor devices without reducing the function of keeping the stacked unit pressurized in the stacking direction.

What is claimed is:

1. A semiconductor device comprising:
   a stacked unit including a semiconductor module and a plurality of coolers each having a flow passage through which a coolant flows, the semiconductor module being disposed between the coolers;
   a coolant supply-discharge pipe configured to supply the coolant to the coolers or discharge the coolant from the coolers, the coolant supply-discharge pipe being passed through the stacked unit in a stacking direction of the stacked unit;
   a displacement restricting member provided at a first end portion of the coolant supply-discharge pipe, the displacement restricting member being configured to restrict displacement of the stacked unit in the stacking direction of the stacked unit; and
   a pressurizing member provided at a second end portion of the coolant supply-discharge pipe, the pressurizing member being configured to apply force to the stacked unit in a direction toward the first end portion, wherein:
   the coolant supply-discharge pipe passes through the coolers of the stacked unit;
   each of the coolers includes two partition plates that face each other across the flow passage in the stacking direction;
   each of the two partition plates has a through-hole through which the coolant supply-discharge pipe is passed; and
   at least one of the two partition plates has a guiding portion configured to guide the coolant supply-discharge pipe to the through-hole when the coolant supply-discharge pipe is inserted into the through-hole.

2. The semiconductor device according to claim 1, wherein
   the coolant supply-discharge pipe includes a thread formed on an outer peripheral surface of the second end portion of the coolant supply-discharge pipe; and
   the pressurizing member includes a nut screwed onto the thread of the coolant supply-discharge pipe.

3. The semiconductor device according to claim 1, wherein the pressurizing member includes an elastic body attached to the second end portion of the coolant supply-discharge pipe, the elastic body being configured to apply elastic force to the stacked unit in the direction toward the first end portion.

4. The semiconductor device according to claim 1, wherein:
   the plurality of coolers comprises an upper cooler and a lower cooler, and
   the guiding portion on the upper cooler and the guiding portion on the lower cooler departs from each other when the coolant supply-discharge pipe is inserted in the through-holes of the upper and lower coolers.

5. A method of manufacturing a semiconductor device, the method comprising:
   forming a stacked unit by disposing a semiconductor module and a plurality of coolers each having a flow passage through which a coolant flows, such that the semiconductor module is disposed between the coolers;
   passing a coolant supply-discharge pipe through the stacked unit;
   providing a first end portion of the coolant supply-discharge pipe with a displacement restricting member configured to restrict displacement of the stacked unit in a stacking direction of the stacked unit; and
   providing a second end portion of the coolant supply-discharge pipe with a pressurizing member configured to apply force to the stacked unit in a direction toward the first end portion, wherein:

the coolant supply-discharge pipe passes through the coolers of the stacked unit;

each of the coolers includes two partition plates that face each other across the flow passage in the stacking direction;

each of the two partition plates has a through-hole through which the coolant supply-discharge pipe is passed; and at least one of the two partition plates has a guiding portion configured to guide the coolant supply-discharge pipe to the through-hole when the coolant supply-discharge pipe is inserted into the through-hole.

6. The method according to claim 5, further comprising:

forming a thread on an outer peripheral surface of the second end portion of the coolant supply-discharge pipe; and screwing a nut onto the thread.

7. The method according to claim 5, further comprising attaching an elastic body to the second end portion of the coolant supply-discharge pipe, the elastic body being configured to apply elastic force to the stacked unit in the direction toward the first end portion.

* * * * *